(12) United States Patent
Yashima et al.

(10) Patent No.: US 8,563,952 B2
(45) Date of Patent: Oct. 22, 2013

(54) CHARGED PARTICLE BEAM WRITING APPARATUS

(75) Inventors: Jun Yashima, Kanagawa (JP); Akihito Anpo, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/469,580

(22) Filed: May 11, 2012

(65) Prior Publication Data

US 2012/0292537 A1    Nov. 22, 2012

(30) Foreign Application Priority Data

May 20, 2011    (JP) .................................. 2011-113006

(51) Int. Cl.
| | |
|---|---|
| *H01J 37/317* | (2006.01) |
| *G03B 27/32* | (2006.01) |
| *G03B 27/42* | (2006.01) |
| *H01J 37/20* | (2006.01) |
| *H01J 37/02* | (2006.01) |
| *H01J 37/153* | (2006.01) |

(52) U.S. Cl.
CPC ................. *H01J 37/20* (2013.01); *H01J 37/02* (2013.01); *H01J 37/153* (2013.01); *Y10S 430/143* (2013.01)
USPC ................ 250/492.22; 250/491.1; 250/492.1; 250/492.3; 250/398; 430/22; 430/30; 430/296; 430/942; 355/53; 355/68; 355/72; 355/75; 355/77

(58) Field of Classification Search
CPC ..... B82Y 10/00; B82Y 40/00; H01J 37/3174; H01J 37/3026; H01J 37/045; H01J 37/153; H01J 37/20; H01J 2237/31769; H01J 2237/0435; H01J 2237/1532; H01J 2237/4534; H01J 2237/20221; H01J 2237/3045; H01J 2237/30461
USPC ........ 250/492.1, 492.2, 492.22, 492.3, 491.1, 250/398; 430/30, 22, 296; 355/68, 72, 75, 355/77
See application file for complete search history.

(56) References Cited

U.S. PATENT DOCUMENTS

| | | | | |
|---|---|---|---|---|
| 5,916,716 | A | * | 6/1999 | Butsch et al. .................... 430/30 |
| 6,064,807 | A | * | 5/2000 | Arai et al. ........................ 430/30 |

(Continued)

FOREIGN PATENT DOCUMENTS

JP    2010-267844    11/2010

OTHER PUBLICATIONS

U.S. Appl. No. 13/765,140, filed Feb. 12, 2013, Kato, et al.

*Primary Examiner* — David A Vanore
(74) *Attorney, Agent, or Firm* — Oblon, Spivak, McClelland, Maier & Neustadt, L.L.P.

(57) ABSTRACT

A charged particle beam writing apparatus, includes a unit to input information about a stripe region height, and to judge, when a write region is divided into stripe regions in a thin rectangular shape by the stripe region height, whether a height of a last stripe region is narrower than the stripe region height; and a unit to divide the write region into stripe regions in the thin rectangular shape in such a way that the last stripe region and a stripe region prior to the last stripe region are combined to create one stripe region and stripe regions at least two stripe regions prior to the last stripe region are each created as stripe regions of the stripe region height if the height of the last stripe region is narrower than the stripe region height.

18 Claims, 12 Drawing Sheets

(56) References Cited

U.S. PATENT DOCUMENTS

| | | | | |
|---|---|---|---|---|
| 6,193,584 | B1 * | 2/2001 | Rudy et al. | 451/5 |
| 6,313,476 | B1 * | 11/2001 | Shimizu et al. | 250/492.22 |
| 6,376,848 | B1 * | 4/2002 | Minami | 250/492.22 |
| 6,503,671 | B1 * | 1/2003 | Nakajima | 430/30 |
| 7,129,024 | B2 * | 10/2006 | Ki | 430/296 |
| 7,230,675 | B2 * | 6/2007 | Kruijswijk et al. | 355/53 |
| 7,233,384 | B2 * | 6/2007 | Venema et al. | 355/53 |
| 7,926,007 | B2 * | 4/2011 | Shibata | 716/55 |
| 8,076,656 | B2 * | 12/2011 | Shibata | 250/492.22 |
| 2006/0119812 | A1 * | 6/2006 | Kruijswijk et al. | 355/53 |
| 2012/0292537 | A1 * | 11/2012 | Yashima et al. | 250/492.22 |

\* cited by examiner

CHARGED PARTICLE BEAM WRITING APPARATUS

CROSS-REFERENCE TO RELATED APPLICATION

This application is based upon and claims the benefit of priority from prior Japanese Patent Application No. 2011-113006 filed on May 20, 2011 in Japan, the entire contents of which are incorporated herein by reference.

BACKGROUND OF THE INVENTION

1. Field of the Invention

Embodiments described herein relate generally to a charged particle beam writing apparatus and a charged particle beam writing method, and for example, relate to a division method of a stripe region for writing.

2. Related Art

A lithography technique which takes a part of the development of miniaturization of semiconductor devices is, among semiconductor manufacturing processes, an extremely important process as the only process to generate a pattern. In recent years, with the high integration of an LSI, circuit line heights required for semiconductor devices are miniaturized year by year. In order to form desired circuit patterns on the semiconductor devices, precise original patterns (also referred to as reticles or masks) are required. In this case, an electron beam writing technique has an essentially excellent resolution, and is used in production of precise original patterns.

FIG. 12 is a conceptual diagram for explaining an operation of a variable-shaped electron beam writing apparatus.

The variable-shaped electron beam (EB: Electron beam) writing apparatus operates as follows. An oblong opening 411 to shape an electron beam 330 is formed in a first aperture plate 410. A variable-shaped opening 421 to shape the electron beam 330 having passed through the opening 411 of the first aperture plate 410 into a desired oblong shape is formed in a second aperture plate 420. The electron beam 330 irradiated from a charged particle source 430 and having passed through the opening 411 of the first aperture plate 410 is deflected by a deflector and passes through a part of the variable-shaped opening 421 of the second aperture plate 420 such that a target object 340 placed on a stage continuously moving in one predetermined direction (for example, an X direction) is irradiated with the electron beam 330. That is, an oblong shape which can pass through both the opening 411 of the first aperture plate 410 and the variable-shaped opening 421 of the second aperture plate 420 is written in a write region of the target object 340 placed on the stage continuously moving in the X direction. A scheme which causes an electron beam to pass through both the opening 411 of the first aperture plate 410 and the variable-shaped opening 421 of the second aperture plate 420 to form an arbitrary shape is called a variable-shaping scheme (VSB scheme).

A writing apparatus divides a write region into stripe regions in a thin rectangular shape of a fixed height (see Published Unexamined Japanese Patent Application No. 2010-267844, for example). Then, each stripe region is divided into a plurality of data processing regions in a direction perpendicular to the direction in which the write region is divided into the stripe regions to perform data processing in units of data processing regions. The division size of the data processing region is set such that the number of beam shots in the region becomes uniform to prevent a delay of write processing. If a portion of a cell is contained in a data processing region, the cell is allocated to the data processing region. Thus, if a cell extends over a plurality of data processing regions, the same cell is allocated to the plurality of data processing regions.

When a write region of a target object such as a mask is divided into the above stripe regions, the height of the last stripe may become extremely smaller than the height of other stripe regions. In other words, the last stripe will have a remaining height dimension after the write region being successively divided. If, in such a case, the last stripe is divided into data processing regions such that the number of beam shots becomes approximately uniform, the height of data processing regions in the last stripe will be larger than the height in other stripe regions. That is, the last stripe will be an elongated data processing region. Thus, if a portion of a cell is contained in a data processing region of the last stripe, the number of the cells will be comparatively larger than the number of cells contained in data processing regions of other stripe regions. Thus, a problem of a longer time of processing needed to determine whether a cell belongs to the data processing region of the last stripe is posed. As a result, a problem that a calculation time when a pattern density or the like in the data processing region of the last stripe is calculated is delayed when compared with data processing regions of other stripe regions is posed.

BRIEF SUMMARY OF THE INVENTION

In accordance with one aspect of this invention, a charged particle beam writing apparatus, includes:
a judgment unit configured to input information about a stripe region height, and to judge, when a write region is divided into a plurality of stripe regions in a thin rectangular shape by the stripe region height, whether a height of a last stripe region of the plurality of stripe regions is narrower than the stripe region height;
a stripe division unit configured to divide the write region into a plurality of stripe regions in the thin rectangular shape in such a way that the last stripe region and a stripe region prior to the last stripe region are combined to create one stripe region and stripe regions at least two stripe regions prior to the last stripe region are each created as stripe regions of the stripe region height if the height of the last stripe region is narrower than the stripe region height;
a processing region division unit configured to divide each stripe region of the plurality of stripe regions divided into a plurality of processing regions in such a way that a number of beam shots is equivalent for each stripe region;
a pattern density operation unit configured to operate a pattern density in each processing region in parallel for the plurality of processing regions for each stripe region;
a dose operation unit configured to operate a dose of a beam by using the pattern density operated; and
a pattern generator configured to write a pattern on a target object by using a charged particle beam of the dose operated.

In accordance with another aspect of this invention, a charged particle beam writing apparatus, includes:
a stripe number operation unit configured to input information about a stripe region height, and to operate a number of stripe regions when a write region is divided into a plurality of stripe regions in a thin rectangular shape by the stripe region height;

a stripe division unit configured to divide the write region into a plurality of stripe regions in the thin rectangular shape by a height obtained by the write region by the number of stripe regions;

a processing region division unit configured to divide each stripe region of the plurality of stripe regions divided into a plurality of processing regions in such a way that a number of beam shots is equivalent for each stripe region;

a pattern density operation unit configured to operate a pattern density in each processing region in parallel for the plurality of processing regions for each stripe region;

a dose operation unit configured to operate a dose of a beam by using the pattern density operated; and a pattern generator configured to write a pattern on a target object by using a charged particle beam of the dose operated.

In accordance with a further aspect of this invention, a charged particle beam writing apparatus, includes:

a judgment unit configured to input information about a stripe region height, and to judge, when a write region is divided into a plurality of stripe regions in a thin rectangular shape by the stripe region height, whether a height of a last stripe region of the plurality of stripe regions is narrower than the stripe region height;

a stripe division unit configured to divide the write region into a plurality of stripe regions in the thin rectangular shape in such a way that the height of the last stripe region and a height of a stripe region prior to the last stripe region are combined and averaged to create two stripe regions of the same height and stripe regions at least two stripe regions prior to the last stripe region are each created as the stripe regions of the stripe region height if the height of the last stripe region is narrower than the stripe region height;

a processing region division unit configured to divide each stripe region of the plurality of stripe regions divided into a plurality of processing regions in such away that a number of beam shots is equivalent for each stripe region; a pattern density operation unit configured to operate a pattern density in each processing region in parallel for the plurality of processing regions for each stripe region;

a dose operation unit configured to operate a dose of a beam by using the pattern density operated; and a pattern generator configured to write a pattern on a target object by using a charged particle beam of the dose operated.

In accordance with another further aspect of this invention, a method for writing a charged particle beam, includes:

inputting information about a stripe region height, and judging, when a write region is divided into a plurality of stripe regions in a thin rectangular shape by the stripe region height, whether a height of a last stripe region of the plurality of stripe regions is narrower than the stripe region height;

dividing the write region into a plurality of stripe regions in the thin rectangular shape in such a way that the last stripe region and a stripe region prior to the last stripe region are combined to create one stripe region and stripe regions at least two stripe regions prior to the last stripe region are each created as stripe regions of the stripe region height if the height of the last stripe region is narrower than the stripe region height;

dividing each stripe region of the plurality of stripe regions divided into a plurality of processing regions in such a way that a number of beam shots is equivalent for each stripe region;

operating a pattern density in each processing region in parallel for the plurality of processing regions for each stripe region;

operating a dose of a beam by using the pattern density operated; and writing a pattern on a target object by using a charged particle beam of the dose operated.

In accordance with another further aspect of this invention, a method for writing a charged particle beam, includes:

inputting information about a stripe region height, and operating a number of stripe regions when a write region is divided into a plurality of stripe regions in a thin rectangular shape by the stripe region height;

dividing the write region into a plurality of stripe regions in the thin rectangular shape by a height obtained by the write region by the number of stripe regions;

dividing each stripe region of the plurality of stripe regions divided into a plurality of processing regions in such away that a number of beam shots is equivalent for each stripe region;

operating a pattern density in each processing region in parallel for the plurality of processing regions for each stripe region;

operating a dose of a beam by using the pattern density operated; and writing a pattern on a target object by using a charged particle beam of the dose operated.

DETAILED DESCRIPTION OF THE INVENTION

In the embodiments below, a configuration using an electron beam as an example of a charged particle beam will be described. The charged particle beam is not limited to an electron beam, and a beam such as an ion beam using charged particles may be used. As an example of the charged particle beam apparatus, a variable-shaped writing apparatus will be described.

Also in the embodiments below, a writing apparatus and a writing method capable of inhibiting the number of cells allocated to data processing regions of the last stripe from markedly increasing when compared with the numbers allocated to data processing regions of other stripe regions will be described.

Embodiment 1

Figure 1:
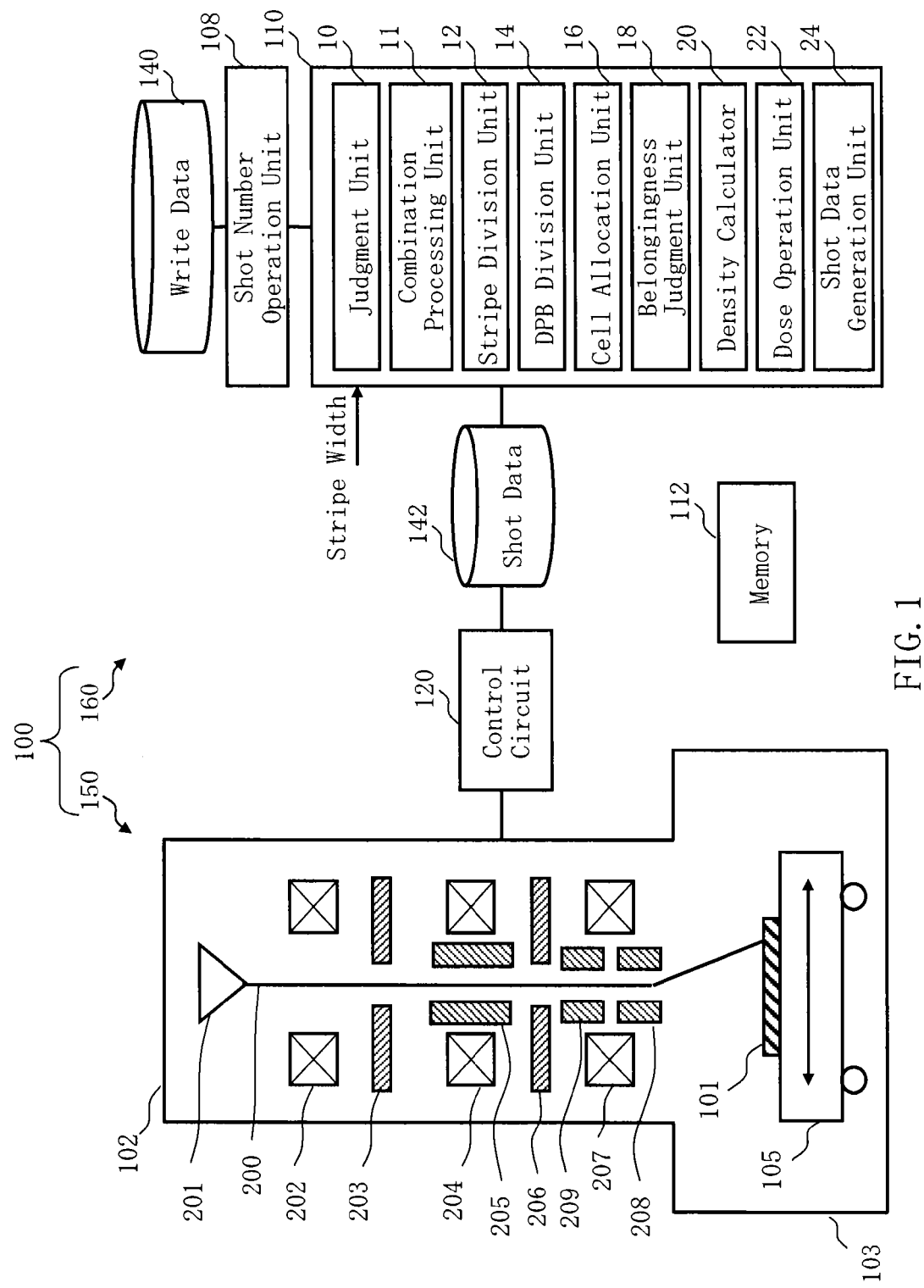
FIG. 1 is a conceptual diagram showing the configuration of a writing apparatus according to Embodiment 1.

FIG. 1 is a conceptual diagram showing the configuration of a writing apparatus according to Embodiment 1. In FIG. 1, a writing apparatus 100 includes a pattern generator 150 and a control unit 160. The writing apparatus 100 is an example of the charged particle beam writing apparatus. Particularly, the writing apparatus 100 is an example of the variable-shaped writing apparatus. The pattern generator 150 includes an electron lens barrel 102 and a write chamber 103. In the electron lens barrel 102, an electron gun assembly 201, an illumination lens 202, a first aperture plate 203, a projection lens 204, a deflector 205, a second aperture plate 206, an objective lens 207, a main deflector 208, and a sub-deflector 209 are arranged. In the write chamber 103, an XY stage 105 is arranged. A target object 101 such as a mask to be written to during writing is arranged on the XY stage 105. The target object 101 contains an exposure mask for fabricating semiconductor devices. The target object 101 also contains mask blanks to which a resist is applied and to which nothing is written.

The control unit 160 includes control computers 108, 110, memory 112, a control circuit 120, and storage devices 140, 142 such as magnetic disk drives, memory or solid state drive (SSD). The control computers 108, 110, the memory 112, the control circuit 120, and the storage devices 140, 142 are mutually connected via a bus (not shown).

In the control computer 110, a judgment unit 10, a combination processing unit 11, a stripe division unit 12, a data processing region (DPB) division unit 14, a cell allocation unit 16, a belongingness judgment unit 18, a density calculator 20, a dose operation unit 22, and a shot data generation unit 24. Functions such as the judgment unit 10, the combination processing unit 11, the stripe division unit 12, the data processing region (DPB) division unit 14, the cell allocation unit 16, the belongingness judgment unit 18, the density calculator 20, the dose operation unit 22, and the shot data generation unit 24 may be configured by hardware such as an electric circuit or software such as a program to execute such functions. Alternatively, such functions may be configured by a combination of hardware and software. Information input into or output from the judgment unit 10, the combination processing unit 11, the stripe division unit 12, the data processing region (DPB) division unit 14, the cell allocation unit 16, the belongingness judgment unit 18, the density calculator 20, the dose operation unit 22, and the shot data generation unit 24 and information during operation are stored in the memory 112 each time.

In FIG. 1, a configuration part required for explaining Embodiment 1 is shown. The writing apparatus 100 may include other generally necessary configurations as a matter of course. For example, a multi-stage (two stages of main and sub) deflector of the main deflector 208 and the sub-deflector 209 is used for position deflection, but a one-stage deflector or a multi-stage deflector of three stages or more may be used for position deflection.

Write data of a chip formed of at least one figure pattern and having a plurality of cells is input into the storage device 140 (storage unit) from outside and stored. In the write data, each piece of figure pattern data indicating the shape, arrangement coordinates, the size and the like of each pattern is defined.

Figure 2:
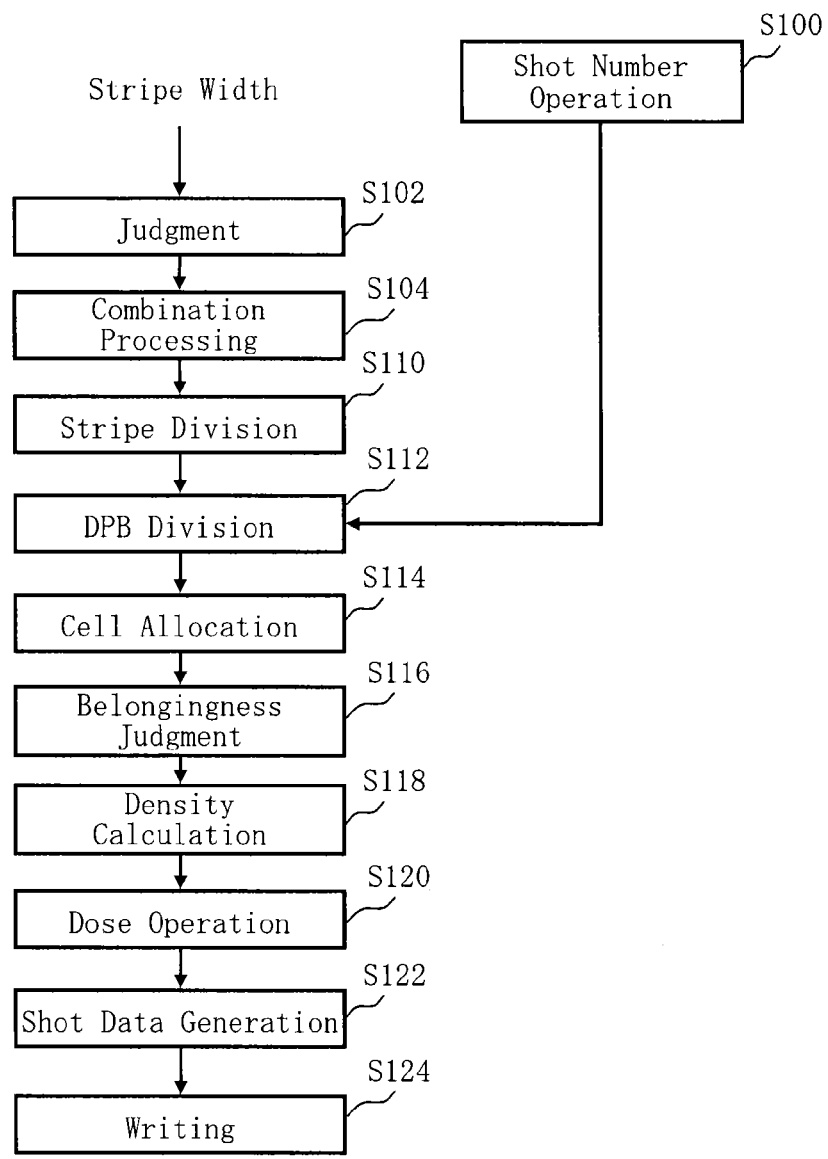
FIG. 2 is a flow chart showing principal processes of a writing method according to Embodiment 1.

FIG. 2 is a flow chart showing principal processes of a writing method according to Embodiment 1. In FIG. 2, the writing method according to Embodiment 1 executes a series of processes including a shot number operation process (S100), a judgment process (S102), a combination processing process (S104), a stripe division process (S110), a data processing region (DPB) division process (S112), a cell allocation process (S114), a belongingness judgment process (S116), a density calculation process (S118), a dose operation process (S120), a shot data generation process (S122), and a writing process (S124).

As the shot number operation process (S100), the control computer 108 estimates by operation the number of shots when a chip defined in write data is written. The control computer 108 functions as an example of a shot number operation unit. To write a figure pattern by the writing apparatus 100, it is necessary to divide each figure pattern defined in the write data to a size that can be irradiated by one beam shot. More specifically, each cell is divided into mesh regions of a predetermined mesh size and the figure inside each mesh region is divided by the maximum shot size. Then, a remaining dimension that cannot be divided by the maximum shot size may be divided by a size obtained by averaging the remaining dimension and the size of the previous figure. By determining the division number of the figure for each mesh in this manner, the number of beam shots is estimated by operation. Data of the estimated numbers of shots is output to the control computer 110. By using such numbers of shots, the division size for creating DPB regions is set.

As the judgment process (S102), the judgment unit 10 inputs information about the stripe region height (or "stripe region width") and judgees, when a write region is divided into a plurality of stripe regions in a thin rectangular shape by the stripe region height, whether a height of a last stripe region of the plurality of stripe regions is narrower than the stripe region height.

Figures 3A, 3B:
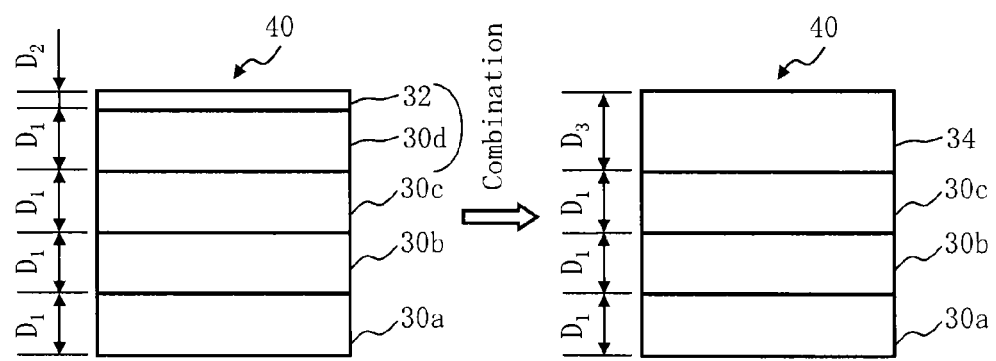
FIGS. 3A and 3B are diagrams showing examples of stripe regions in Embodiment 1.

FIGS. 3A and 3B are diagrams showing examples of stripe regions in Embodiment 1. As shown in FIG. 3A, the writing apparatus 100 divides a write region (chip region) 40 into a plurality of stripe regions 30 (30a, 30b, 30c and 30d) in a thin rectangular shape of a predetermined height or "width" in, for example, the y direction. Then, write processing is performed in units of stripe regions. The height (predetermined height) of such stripe regions is generally set to a size that can be deflected by the main deflector 208. Normally, the writing apparatus 100 has a stripe division height (or "stripe division width") $D_1$ input from outside and divides the write region into a plurality of stripe regions 30 by the stripe division height $D_1$ from the write starting side. In FIG. 3, for example, the write region is divided upward from below. In this case, as shown in FIG. 3A, depending on the chip size, a height $D_2$ of a last stripe region 32 of the plurality of stripe regions may be extremely narrower than a height $D_1$ of each stripe region 30a to 30d. The judgment unit 10 judges whether the height of the last stripe region becomes narrower than the stripe region height.

As the combination processing process (S104), if the height $D_2$ of the last stripe region 32 becomes narrower than the set stripe region height $D_1$, the combination processing unit 11 combines the height $D_2$ of the last stripe region 32 and the height $D_1$ of the previous stripe region 30d. Then, the combination processing unit 11 outputs a combined height $D_3$.

As the stripe division process (S110), as shown in FIG. 3B, the stripe division unit 12 divides the write region 40 into a plurality of stripe regions in a thin rectangular shape of the set stripe region height $D_1$ for each of the stripe regions 30a to 30c at least two stripe regions prior to the last stripe region 32. Then, if the height $D_2$ of the last stripe region 32 of the plurality of stripe regions becomes narrower than the stripe region height as shown in FIG. 3B, the stripe division unit 12 divides the write region 40 such that the last stripe region 32 and the stripe region 30d prior to the last stripe region 32 are combined to create one stripe region 34 of the height $D_3$. In other words, the one stripe region 34 is created by the last stripe region 32 being incorporated into the stripe region 30d prior to the last stripe region 32.

As the data processing region (DPB) division process (S112), the DPB division unit 14 divides each stripe region of the plurality of stripe regions divided into a plurality of data processing regions (DPB) (example of the processing region) such that the number of beam shots is equivalent for each stripe region. The DPB division unit 14 is an example of a processing region division unit.

Figure 4A:
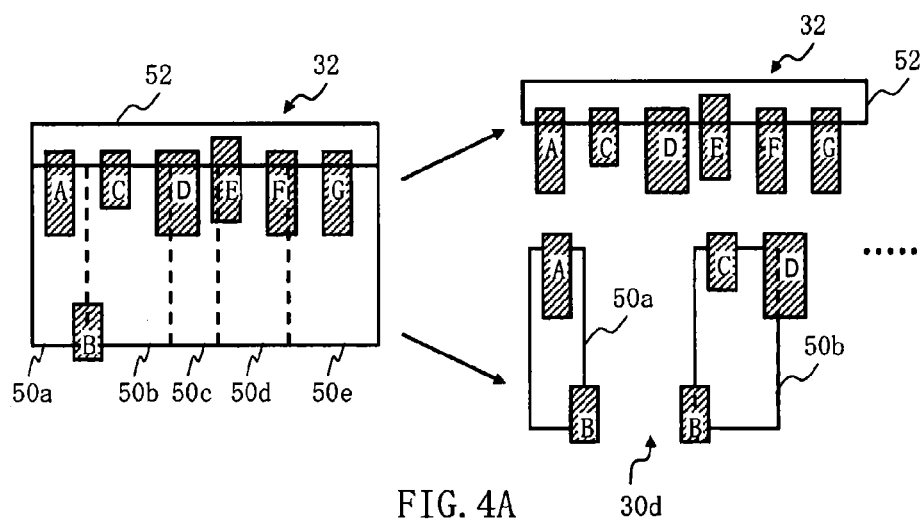
FIGS. 4A and 4B are conceptual diagrams for explaining differences of data processing division between a last stripe region before combination and a last stripe region after combination in Embodiment 1.
Figure 4B:
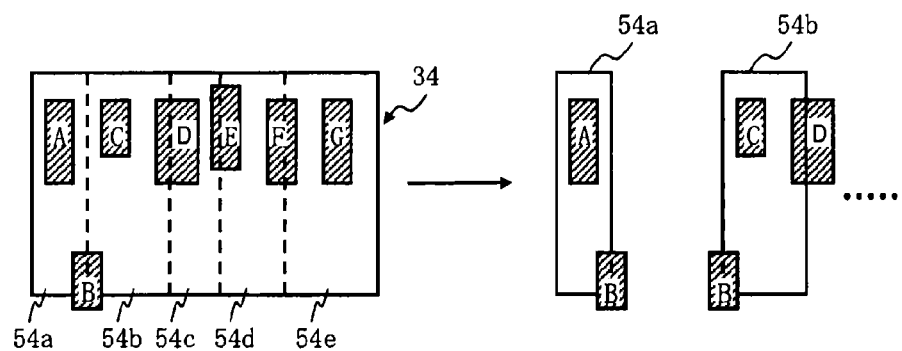

FIGS. 4A and 4B are conceptual diagrams for explaining differences of data processing division between a last stripe region before combination and a last stripe region after combination in Embodiment 1. FIG. 4A shows a case when, like in the past, the last stripe region 32 has an extremely narrow height when compared with the other stripe regions 30 (here, the stripe region 30d is illustrated). FIG. 4A shows a case when, for example, a plurality of cells A, C to G is arranged extending over the last stripe region 32 and the previous stripe region 30d and a cell B is arranged extending over the stripe region 30d and the stripe region (not shown) (corresponding to the stripe region 30c) prior thereto. Also in FIG. 4A, a case when the most part of each of the cells A, C to G is contained in the stripe region 30d when compared with the last stripe region 32. Because the most part of each of the cells A, C to G is contained in the stripe region 30d, the stripe region 30d has more shots for the contained region portion of each cell when compared with the last stripe region 32. Thus, the number of shots in the whole stripe region 30d becomes comparatively larger than in the last stripe region 32. As a result, if the two stripe regions 30d, 32 are divided into DPB regions such that the number of shots inside becomes approximately uniform, the stripe region 30d is divided into a plurality of DPB regions 50a to 50e in a direction perpendicular to the stripe division direction (left and right direction in FIG. 4). On the other hand, the last stripe region 32 originally has a small number of shots in the whole region and, for example, the whole last stripe region 32 becomes one DPB region 52.

By contrast, in Embodiment 1, as shown in FIG. 4B, the last stripe region 32 and the stripe region 30d prior to the last stripe region 32 are combined to create the one stripe region 34. Thus, the plurality of cells A to G is arranged in the stripe region 34. Thus, the stripe region 34 as a whole has more shots than the last stripe region 32 before being combined. As a result, if the stripe region 34 is divided into DPB regions such that the number of shots inside becomes approximately uniform, the stripe region 34 is divided into a plurality of DPB regions 54a to 54e in a direction perpendicular to the stripe division direction (left and right direction in FIG. 4B).

Next, as the cell allocation process (S114), the cell allocation unit 16 allocates a corresponding cell of the plurality of cells to a corresponding DPB region of the plurality of DPB regions divided if a portion of the corresponding cell is contained in the corresponding DPB region. Thus, if the last stripe region 32 has an extremely narrow height when compared with the other stripe regions 30 (here, the stripe region 30d is illustrated) like in the past, as shown in FIG. 4A, the six cells A, C to G are allocated to the one DPB region 52. On the other hand, two cells A, B are allocated to the DPB region 50a equivalent in number of shots to the DPB region 52. Similarly, three cells B, C, D are allocated to the DPB region 50b. Similarly, two cells D, E are allocated to the DPB region 50c. Similarly, two cells E, F are allocated to the DPB region 50d. Similarly, two cells F, G are allocated to the DPB region 50e. Thus, more cells are allocated to the DPB region 52 of the last stripe region 32 when compared with each of the DPB regions 50a to 50e of the previous stripe region 30d.

In Embodiment 1, by contrast, as shown in FIG. 4B, there is no stripe region whose height is extremely narrow and thus, two cells A, B are allocated to the DPB region 54a. Similarly, three cells B, C, D are allocated to the DPB region 54b. Similarly, two cells D, E are allocated to the DPB region 54c. Similarly, two cells E, F are allocated to the DPB region 54d. Similarly, two cells F, G are allocated to the DPB region 54e. Thus, in the DPB regions 54a to 54e of the last stripe region 34, a DPB region to which comparatively more cells are allocated than other regions can be prevented from arising.

As the belongingness judgment process (S116), the belongingness judgment unit 18 judges whether all figure patterns in each cell allocated to each DPB region belongs to the DPB region. According to a conventional technique, as shown in FIG. 4A, more cells are allocated to the DPB region 52 of the last stripe region 32 when compared with each of the DPB regions 50a to 50e of the other stripe region 30d and thus, the number of figure patterns for belongingness judgments to be made will be huge when compared with the DPB regions 50a to 50e. Therefore, the time needed for belongingness judgment processing of the DPB region 52 of the last stripe region 32 will be comparatively longer than the time needed for each of the DPB regions 50a to 50e of the other stripe region 30d. As a result, the next data processing cannot be started before the belongingness judgment processing of the DPB region 52 is completed, resulting in a longer writing time.

According to Embodiment 1, by contrast, as shown in FIG. 4B, the number of cells allocated to the DPB regions 54A to 54e of the last stripe region 34 can be made smaller than in the past and thus, the number of figure patterns for belongingness judgments to be made in each of the DPB regions 54a to 54e can be reduced. As a result, belongingness judgment processing in each of the DPB regions 54a to 54e can be made faster such that the next data processing can be started immediately. As a result, the writing time can be made shorter than in the past.

As the density calculation process (S118), the density calculator 20 calculates a pattern density in each DPB region in parallel for a plurality of DPB regions for each stripe region. The density calculator 20 is an example of a pattern density operation unit. More specifically, the density calculator 20 operates an area density ρ of figure patterns arranged in each mesh region of a plurality of mesh regions after each DPB region being divided into the plurality of mesh regions. The mesh size is preferably set to, for example, a size for making a proximity effect correction. For example, the mesh size is set to about 1/10 of the radius of influence of the proximity effect. For example, the mesh size is suitably set to about 1

μm. The density calculation is not limited to the mesh for proximity effect. For example, the area density ρ of a mesh for fogging to correct for fogging effects may be operated. The fogging effects have the radius of influence of a few mm and thus, the size of the mesh for fogging is suitably set to about ¹⁄₁₀ of the radius of influence, for example, to 1 mm.

As the dose operation process (S120), the dose operation unit 22 operates a dose of a beam by using the pattern density operated. The dose operation unit 22 operates the dose necessary for each mesh region of a predetermined size. The dose can be operated as a value obtained by multiplying base doses of the beam Dbase by a correction coefficient. As the correction coefficient, for example, a proximity effect correction irradiation coefficient Dp(ρ) to correct the proximity effect may suitably be used. The proximity effect correction irradiation coefficient Dp(ρ) is a function depending on the pattern density ρ of the mesh for proximity effect. Further, when a fogging correction is made, the correction can be operated as a value obtained by multiplying the base doses of the beam Dbase by a fogging effect correction irradiation coefficient Df(ρ). The fogging effect correction irradiation coefficient Df(ρ) is a function depending on the pattern density ρ of the mesh for fogging. In addition, the dose may suitably be corrected by a correction coefficient D1 (ρ) for loading effect correction. A portion or all of these correction coefficients may be multiplied by the base doses of the beam Dbase for correction. For these corrections, pattern densities in respective mesh regions for calculation are used. Then, the dose operation unit 22 creates a dose map that defines each operated dose for each region. The generated dose map is stored in the storage device 142.

As the shot data generation process (S122), the shot data generation unit 24 reads write data from the storage device 140 and performs multi-stage data conversion processing to generate shot data specific to the apparatus. To write a figure pattern by the writing apparatus 100, as described above, it is necessary to divide each figure pattern defined in the write data to a size that can be irradiated by one beam shot. Thus, the shot data generation unit 24 generates shot figures by dividing each figure pattern into sizes that can be irradiated by one beam shot before actually writing the figure pattern. Then, the shot data generation unit 24 generates shot data for each shot figure. In the shot data, for example, figure data such as the figure type, figure size, and irradiation position is defined. The generated shot data is stored in the storage device 142.

As the writing process (S124), the control circuit 120 has shot data and a dose map input from the storage device 142 and controls the pattern generator 150, and the pattern generator 150 uses an electron beam 200 to write a pattern on the target object 101 with the dose operated of the electron beam 200. More specifically, the write unit 150 operates as follows.

The electron beam emitted from the electron gun assembly 201 (emitting unit) illuminates the entire first aperture plate 203 having an oblong, for example, rectangular hole via the illumination lens 202. In this case, the electron beam 200 is shaped into an oblong, for example, a rectangle first. The electron beam 200 of a first aperture plate image having passed through the first aperture plate 203 is projected on the second aperture plate 206 by the projection lens 204. The first aperture plate image on the second aperture plate 206 is controlled to deflect by the deflector 205 such that the beam shape and dimensions can be changed (variable-shaped). Then, the electron beam 200 of a second aperture plate image having passed through the second aperture plate 206 is focused by the objective lens 207 and deflected by the main deflector 208 and the sub-deflector 209 such that a desired position of the target object 101 placed on the XY stage 105 moving continuously is irradiated with the electron beam 200. FIG. 1 shows a case when multi-stage (two stages of main and sub) deflection is used for position deflection. In such a case, the electron beam 200 of the shot may be deflected to the reference position of a sub-field (SF) obtained by further dividing a stripe region virtually by the main deflector 208 while following the stage movement and the beam of the shot may be deflected to each irradiation position inside the SF by the sub-deflector 209.

According to Embodiment 1, as described above, the number of cells allocated to the DPB region 54 (54a-54e) of the last stripe region 34 can be inhibited from markedly increasing when compared with DPB regions of the other stripe regions 30. Therefore, the time needed to determine whether any cell belongs to the DPB region 54 of the last stripe region 34 can be inhibited from becoming too long. As a result, the calculation time needed to calculate a pattern density or the like in a data processing area of the last stripe can be inhibited from delaying when compared with a data processing area of other stripe regions. Therefore, the writing time can be made shorter.

Embodiment 2

In Embodiment 1, one stripe region is created by the last stripe region with a narrow height being incorporated into the previous stripe region, but is not limited to the above example. In Embodiment 2, a configuration to average a stripe region after being combined will be described.

Figure 5:
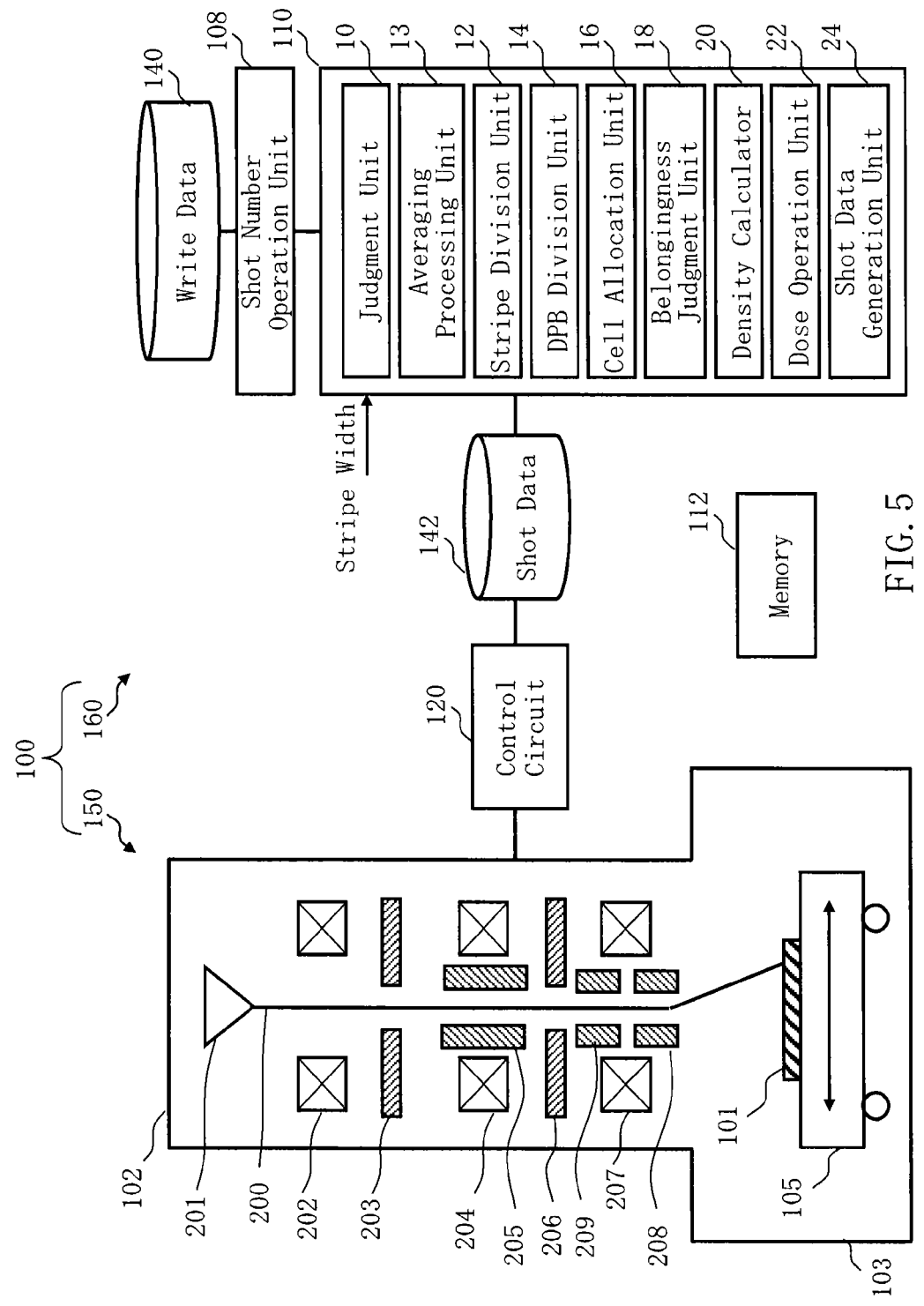
FIG. 5 is a conceptual diagram showing the configuration of the writing apparatus according to Embodiment 2.

FIG. 5 is a conceptual diagram showing the configuration of the writing apparatus according to Embodiment 2. FIG. 5 is the same as FIG. 1 except that instead of the combination processing unit 11, an averaging processing unit 13 is arranged. Functions such as the judgment unit 10, the averaging processing unit 13, the stripe division unit 12, the data processing region (DPB) division unit 14, the cell allocation unit 16, the belongingness judgment unit 18, the density calculator 20, the dose operation unit 22, and the shot data generation unit 24 may be configured by hardware such as an electric circuit or software such as a program to execute such functions. Alternatively, such functions may be configured by a combination of hardware and software. Information input into or output from the judgment unit 10, the averaging processing unit 13, the stripe division unit 12, the data processing region (DPB) division unit 14, the cell allocation unit 16, the belongingness judgment unit 18, the density calculator 20, the dose operation unit 22, and the shot data generation unit 24 and information during operation are stored in the memory 112 each time.

Figure 6:
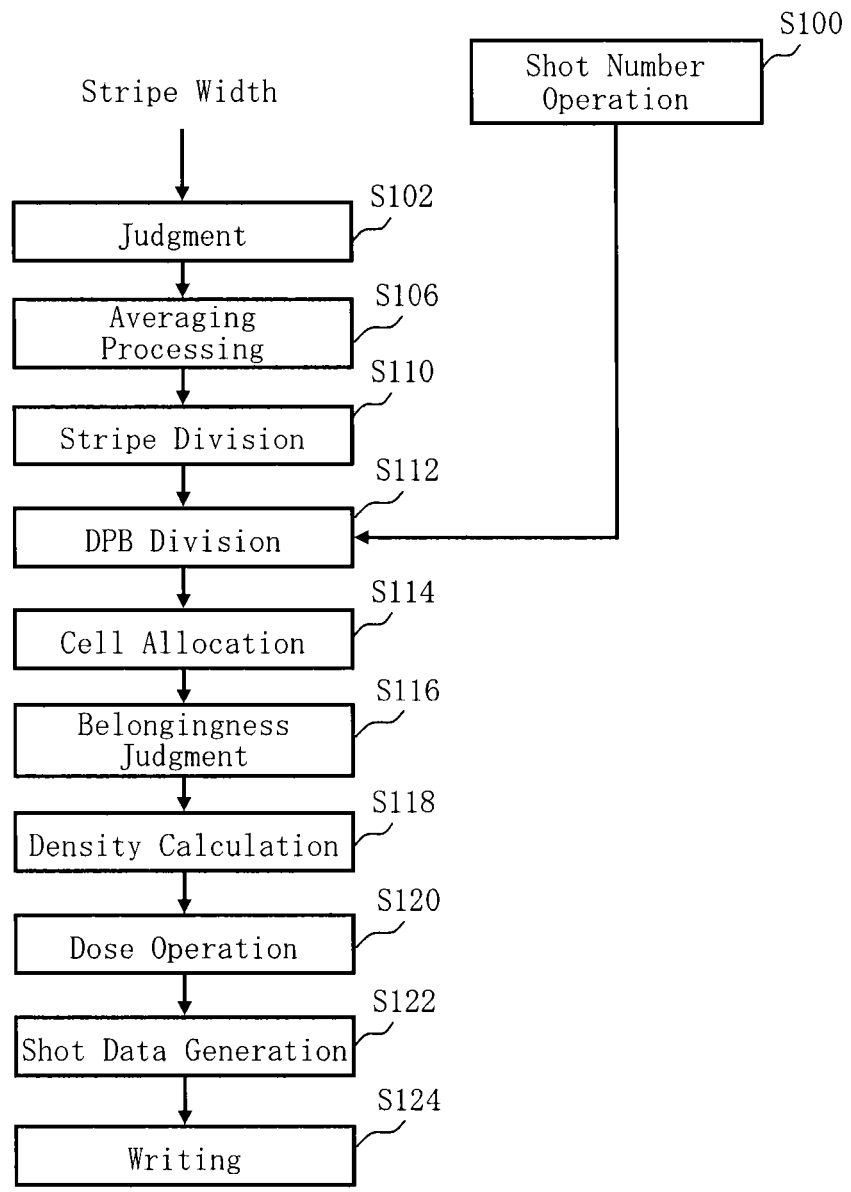
FIG. 6 is a flowchart showing principal processes of the writing method according to Embodiment 2.

FIG. 6 is a flow chart showing principal processes of the writing method according to Embodiment 2. FIG. 6 is the same as FIG. 2 except that instead of the combination processing process (S104), an averaging processing process (S106) is added. Content that is not specifically described below is the same as in Embodiment 1.

As the judgment process (S102), the judgment unit 10 has information about the stripe region height input thereinto to judge whether the height of the last stripe region becomes narrower than the stripe region height when a write region is divided into a plurality of stripe regions in a thin rectangular shape of the stripe region height.

Figures 7A, 7B:
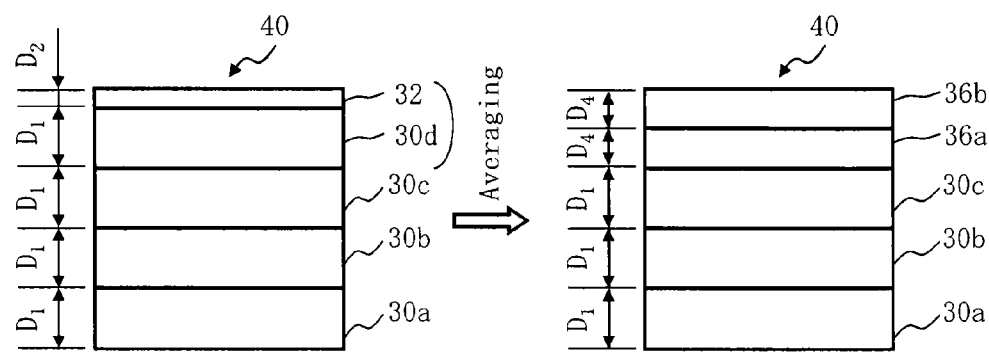
FIGS. 7A and 7B are diagrams showing examples of stripe regions in Embodiment 2.

FIGS. 7A and 7B are diagrams showing examples of stripe regions in Embodiment 2. As shown in FIG. 7A, the writing apparatus 100 divides the write region (chip region) 40 into the plurality of stripe regions 30 in a thin rectangular shape of a predetermined height in, for example, the y direction. As described above, the writing apparatus 100 has the stripe division height $D_1$ input from outside and divides the write region into the plurality of stripe regions 30 by the stripe division height $D_1$ from the write starting side. In this case, as shown in FIG. 7A, depending on the chip size, the height $D_2$ of the last stripe region 32 of the plurality of stripe regions may be extremely narrower than the height $D_1$ of each of the stripe regions 30a to 30d. The judgment unit 10 judges whether the height of the last stripe region becomes narrower than the stripe region height.

As the averaging processing process (S106), if the height $D_2$ of the last stripe region 32 becomes narrower than the set stripe region height $D_1$, the averaging processing unit 13 operates a height $D_4$ equal to a height obtained by combining and averaging the height $D_2$ of the last stripe region 32 and the height $D_1$ of the stripe region 30d prior to the last stripe region 32. Then, the averaging processing unit 13 outputs the averaged height $D_4$.

As the stripe division process (S110), as shown in FIG. 7B, the stripe division unit 12 divides the write region 40 into a plurality of stripe regions in a thin rectangular shape of the set stripe region height $D_1$ for each of the stripe regions 30a to 30c at least two stripe regions prior to the last stripe region 32. Then, if the height $D_2$ of the last stripe region 32 of the plurality of stripe regions becomes narrower than the stripe region height as shown in FIG. 7B, the stripe division unit 12 divides the write region 40 such that the last stripe region 32 and the stripe region 30d prior to the last stripe region 32 are combined and averaged to create two stripe regions 36a, 36b of the same stripe region height $D_4$. In other words, the two stripe regions 36a, 36b are created by the last stripe region 32 being incorporated into the stripe region 30d prior to the last stripe region 32 and averaged.

As the DPB division process (S112), the DPB division unit 14 divides the stripe region into a plurality of DPB regions such that the number of beam shots becomes equivalent for each divided stripe region.

Figure 8A:
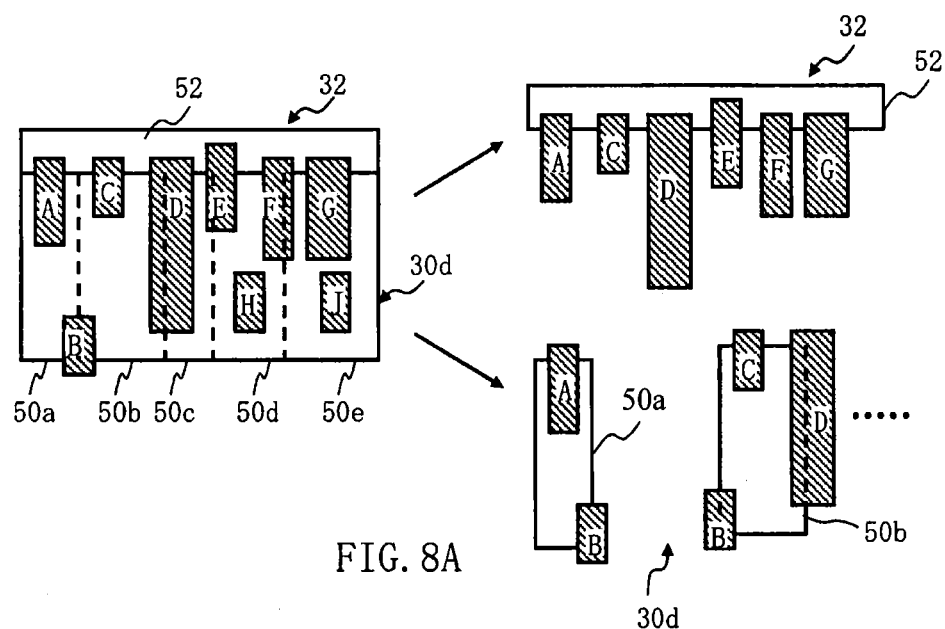
FIGS. 8A and 8B are conceptual diagrams for explaining differences of data processing division between a last stripe region before combination and a last stripe region after combination in Embodiment 2.
Figure 8B:
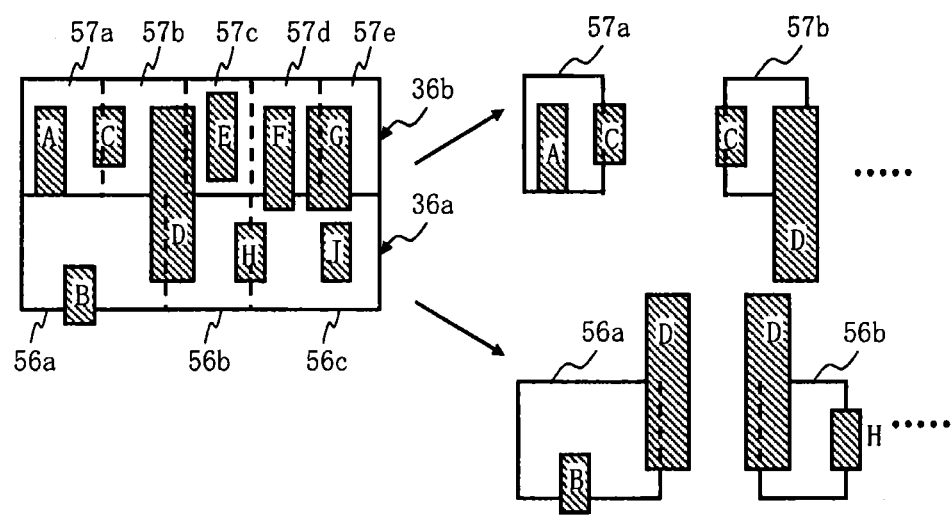

FIGS. 8A and 8B are conceptual diagrams for explaining differences of data processing division between a last stripe region before combination and a last stripe region after combination in Embodiment 2. FIG. 8A shows a case when, like in the past, the last stripe region 32 has an extremely narrow height when compared with the other stripe regions 30 (here, the stripe region 30d is illustrated). FIG. 8A shows a case when, for example, a plurality of cells A, C to G is arranged extending over the last stripe region 32 and the previous stripe region 30d, a cell B is arranged extending over the stripe region 30d and the stripe region (not shown) (corresponding to the stripe region 30c) prior thereto, and cells H, J are arranged in the stripe region 30d. Also in FIG. 8A, a case when the most part of each of the cells A, C to G is contained in the stripe region 30d when compared with the last stripe region 32. Because the most part of each of the cells A, C to G is contained in the stripe region 30d, the stripe region 30d has more shots for the contained region portion of each cell when compared with the last stripe region 32. Thus, the number of shots in the whole stripe region 30d becomes comparatively larger than in the last stripe region 32. As a result, if the two stripe regions 30d, 32 are divided into DPB regions such that the number of shots inside becomes approximately uniform, the stripe region 30d is divided into a plurality of DPB regions 50a to 50e in a direction perpendicular to the stripe division direction (left and right direction in FIG. 4). On the other hand, the last stripe region 32 originally has a small number of shots in the whole region and, for example, the whole last stripe region 32 becomes one DPB region 52.

In Embodiment 2, by contrast, as shown in FIG. 8B, the two stripe regions 36a, 36b are created by adding and averaging the last stripe region 32 and the stripe region 30d prior to the last stripe region 32. Thus, an extreme bias of ratios of shots of region portions of each cell contained in each of the two stripe regions 36a, 36b of the same height will not arise. As a result, if the two stripe regions 36a, 36b are divided into DPB regions such that the number of shots inside becomes approximately uniform, the stripe region 36a is divided into, for example, a plurality of DPB regions 56a to 56c in a direction perpendicular to the stripe division direction (left and right direction in FIG. 8B). The stripe region 36b is divided into, for example, a plurality of DPB regions 57a to 57e in a direction perpendicular to the stripe division direction (left and right direction in FIG. 8B).

Next, as the cell allocation process (S114), the cell allocation unit 16 allocates a corresponding cell of the plurality of cells to a corresponding DPB region of the plurality of DPB regions divided if a portion of the corresponding cell is contained in the corresponding DPB region. Thus, if the last stripe region 32 has an extremely narrow height when compared with the other stripe regions 30 (here, the stripe region 30d is illustrated) like in the past, as shown in FIG. 8A, the six cells A, C to G are allocated to the one DPB region 52. On the other hand, two cells A, B are allocated to the DPB region 50a equivalent in number of shots to the DPB region 52. Similarly, three cells B, C, D are allocated to the DPB region 50b. Similarly, two cells D, E are allocated to the DPB region 50c. Similarly, three cells E, F and H are allocated to the DPB region 50d. Similarly, three cells F, G and J are allocated to the DPB region 50e. Thus, more cells are allocated to the DPB region 52 of the last stripe region 32 when compared with each of the DPB regions 50a to 50e of the previous stripe region 30d.

In Embodiment 2, by contrast, as shown in FIG. 4B, there is no stripe region whose height is extremely narrow and thus, two cells B, D are allocated to the DPB region 56a of the stripe region 36a. Similarly, two cells D, H are allocated to the DPB region 56b. Similarly, four cells F, G, H, J are allocated to the DPB region 56c. Similarly, two cells A, C are allocated to the DPB region 57a of the stripe region 36b. Similarly, two cells C, D are allocated to the DPB region 57b. Similarly, two cells D, E are allocated to the DPB region 57c. Similarly, two cells F, G are allocated to the DPB region 57d. Similarly, one cell G is allocated to the DPB region 57e. Thus, in the DPB regions 56a to 56c, 57a to 57e of the averaged two stripe regions 36a, 36b, a DPB region to which comparatively more cells are allocated than other regions can be prevented from arising.

As the belongingness judgment process (S116), the belongingness judgment unit 18 judges whether all figure patterns in each cell allocated to each DPB region belongs to the DPB region. According to a conventional technique, as shown in FIG. 8A, more cells are allocated to the DPB region 52 of the last stripe region 32 when compared with each of the DPB regions 50a to 50e of the other stripe region 30d and thus, the number of figure patterns for belongingness judgments to be made will be huge when compared with the DPB regions 50a to 50e. Therefore, the time needed for belongingness judgment processing of the DPB region 52 of the last stripe region 32 will be comparatively longer than the time needed for each of the DPB regions 50a to 50e of the other stripe region 30d.

In Embodiment 2, by contrast, as shown in FIG. 8B, the number of cells allocated to each of the DPB regions 56a to 56c, 57a to 57e of the two averaged stripe regions 36a, 36b can be made smaller than in the past and thus, the number of figure patterns for belongingness judgments to be made in each of the DPB regions 56a to 56c, 57a to 57e can be reduced. As a result, belongingness judgment processing in each of the DPB regions 56a to 56c, 57a to 57e can be made faster such that the next data processing can be started immediately. As a result, the writing time can be made shorter than in the past.

According to Embodiment 2, as described above, the number of cells allocated to each of the DPB regions 56a to 56c, 57a to 57e of the last and the previous (two) stripe regions 36a, 36b can be inhibited from markedly increasing when compared with DPB regions of the other stripe regions 30. Therefore, the time needed to determine whether any cell belongs to each of the DPB regions 56a to 56c, 57a to 57e of the two stripe regions 36a, 36b can be inhibited from becoming too long. As a result, the calculation time needed to calculate a pattern density or the like in a data processing area of the last stripe can be inhibited from delaying when compared with a data processing area of other stripe regions. Therefore, the writing time can be made shorter.

Embodiment 3

In Embodiments 1, 2, the stripe height of the last stripe region and the previous stripe region is adjusted, but adjustments of the stripe height are not limited to such examples. In Embodiment 3, a configuration to average all stripe regions will be described.

Figure 9:
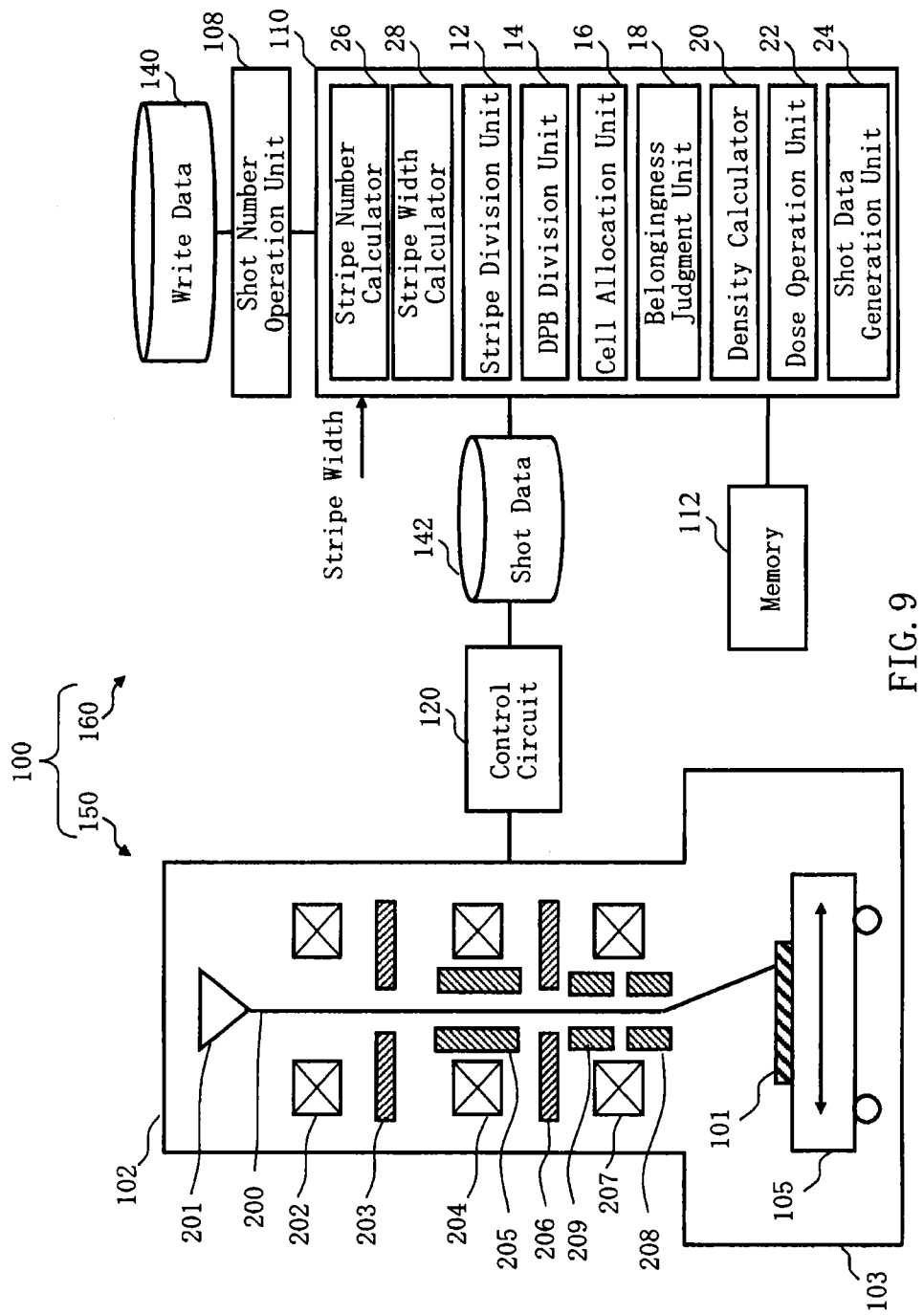
FIG. 9 is a conceptual diagram showing the configuration of the writing apparatus according to Embodiment 3.

FIG. 9 is a conceptual diagram showing the configuration of the writing apparatus according to Embodiment 3. FIG. 9 is the same as FIG. 1 except that instead of the judgment unit 10 and the combination processing unit 11, a stripe number operation unit 26 and a stripe height calculator 28 are arranged. Functions such as the stripe number operation unit 26, the stripe height calculator 28, the stripe division unit 12, the data processing region (DPB) division unit 14, the cell allocation unit 16, the belongingness judgment unit 18, the density calculator 20, the dose operation unit 22, and the shot data generation unit 24 may be configured by hardware such as an electric circuit or software such as a program to execute such functions. Alternatively, such functions may be configured by a combination of hardware and software. Information input into or output from the stripe number operation unit 26, the stripe height calculator 28, the stripe division unit 12, the data processing region (DPB) division unit 14, the cell allocation unit 16, the belongingness judgment unit 18, the density calculator 20, the dose operation unit 22, and the shot data generation unit 24 and information during operation are stored in the memory 112 each time.

Figure 10:
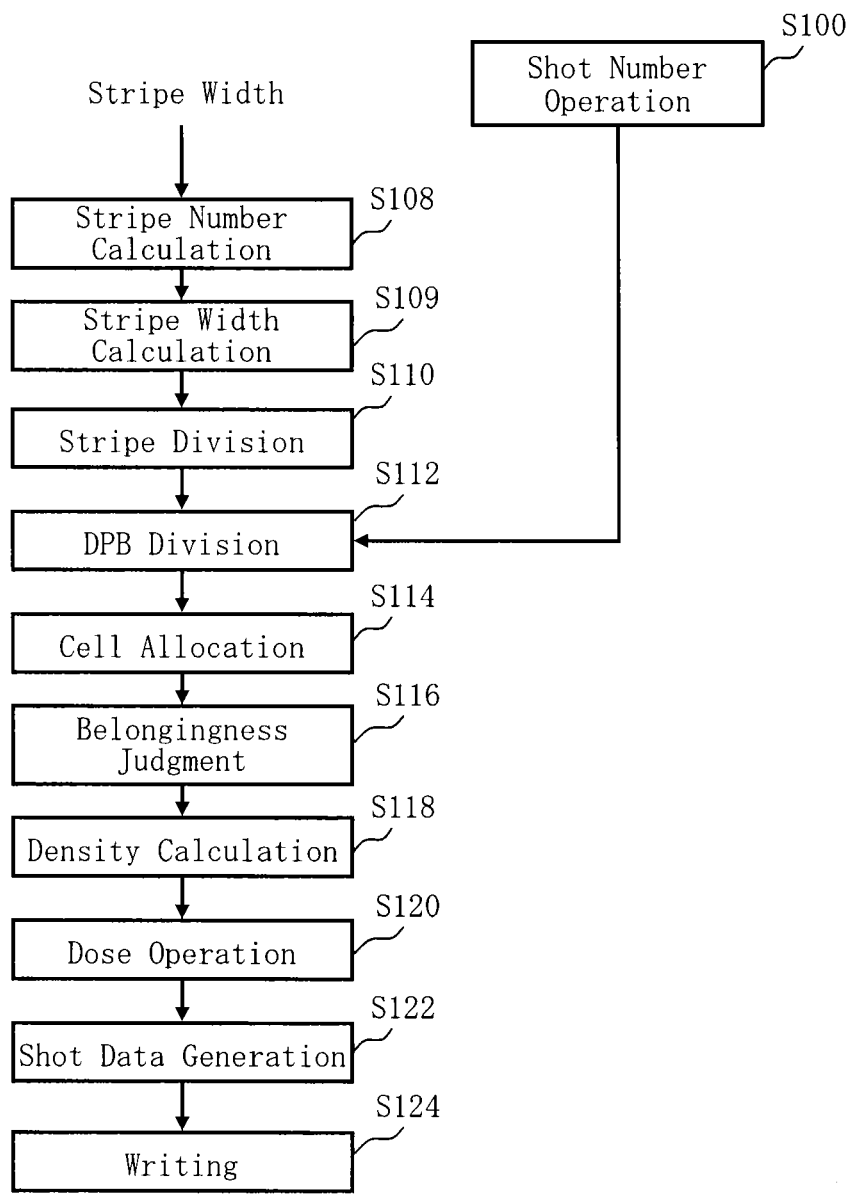
FIG. 10 is a flow chart showing principal processes of the writing method according to Embodiment 3.

FIG. 10 is a flow chart showing principal processes of the writing method according to Embodiment 3. FIG. 10 is the same as FIG. 2 except that instead of the judgment process (S102) and the combination processing process (S104), a stripe number operation process (S108) and a stripe height calculation process (S109) are added. Content that is not specifically described below is the same as in Embodiment 1.

As the stripe number operation process (S108), the stripe number operation unit 26 inputs information about a stripe region height and operates the number of stripe regions obtained when the write region is divided into a plurality of stripe regions in a thin rectangular shape of the stripe region height.

Figure 11A:
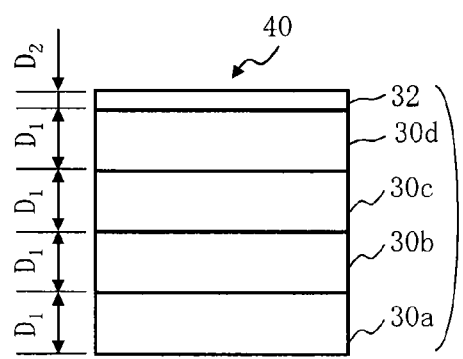
FIGS. 11A and 11B are diagrams showing examples of stripe regions in Embodiment 3.
Figure 11B:
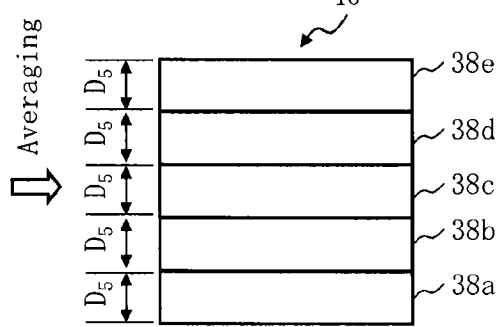
Figure 12:
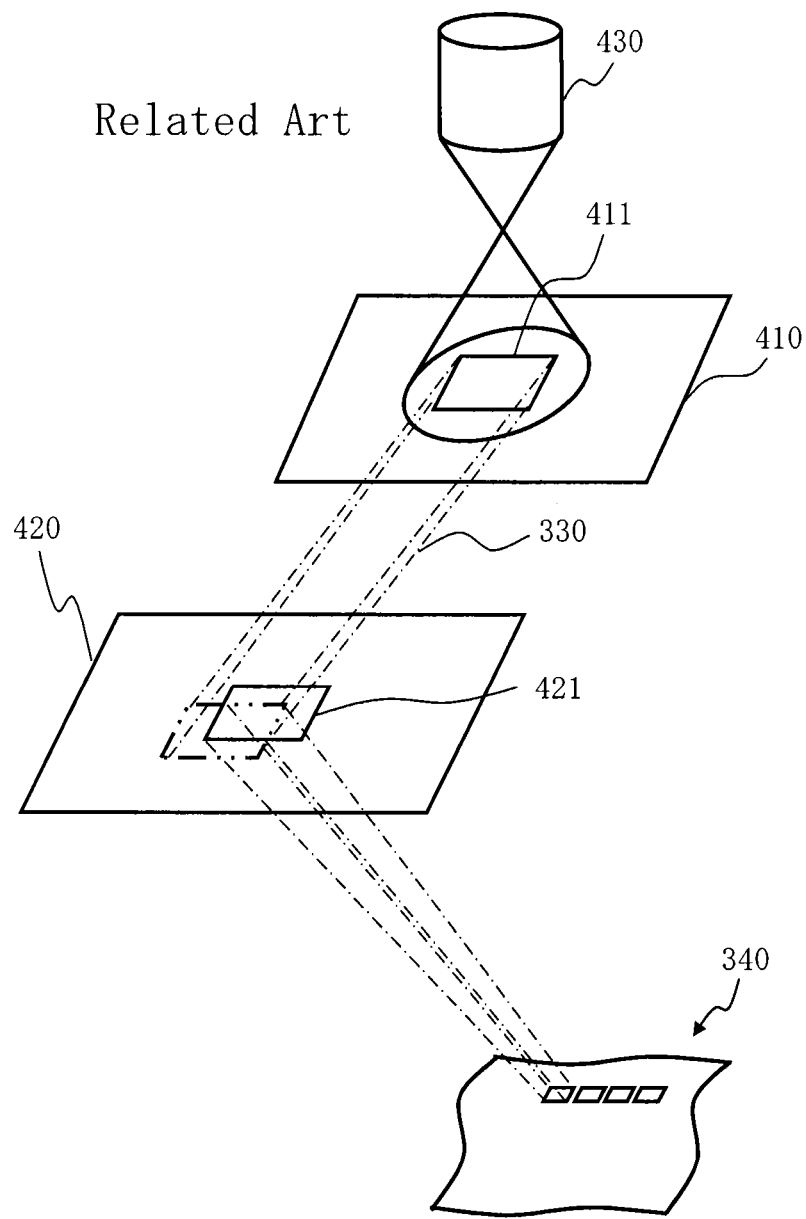
FIG. 12 is a conceptual diagram for explaining an operation of a variable-shaped electron beam writing apparatus.

FIGS. 11A and 11B are diagrams showing examples of stripe regions in Embodiment 3. FIG. 11A is similar to FIG. 3A. As shown in FIG. 11A, the writing apparatus 100 divides the write region (chip region) 40 into the plurality of stripe regions 30 in a thin rectangular shape of a predetermined height in, for example, the y direction. As described above, the writing apparatus 100 has the stripe division height $D_1$ input from outside and divides the write region into a plurality of stripe regions 30 by the stripe division height $D_1$ from the write starting side. In this case, as shown in FIG. 11A, depending on the chip size, the height $D_2$ of the last stripe region 32 of the plurality of stripe regions may be extremely narrower than the height $D_1$ of each of the stripe regions 30a to 30d. The stripe number operation unit 26 operates the number of stripe regions including such an extremely narrow last stripe region. In the example of FIG. 11A, the number of stripe regions is "five".

As the stripe height calculation process (S109), the stripe height calculator 28 operates, as shown in FIG. 11B, operates a height $D_5$ obtained by dividing the write region by the operated number of stripe regions. In other words, instead of the stripe height $D_1$ set initially, the stripe height calculator 28 determines the stripe height $D_5$ that averages the whole write region by the number of stripe regions.

As the stripe division process (S110), as shown in FIG. 11B, the stripe division unit 12 divides the write region into a plurality of stripe regions 38a to 38e in a thin rectangular shape of the stripe region height $D_5$ obtained by dividing the write region by the number of stripe regions.

In Embodiment 3, as shown in FIG. 11B, the stripe regions 38a to 38e of the same height adjusted to the average height of the whole write region are created. Thus, an extreme bias of ratios of shots of region portions of each cell contained in each of the stripe regions of the same height will not arise. As a result, even if each of the stripe regions 38a to 38e is divided into DPB regions such that the number of shots inside becomes approximately uniform, a DPB region to which comparatively more cells are allocated than other regions can be prevented from arising.

Thus, in Embodiment 3, the number of cells allocated to each DPB region of each of the averaged stripe regions 38a to 38e can be made smaller than in the past and thus, the number of figure patterns for belongingness judgments to be made in each DPB region can be reduced. As a result, belongingness judgment processing in each DPB region can be made faster such that the next data processing can be started immediately. As a result, the writing time can be made shorter than in the past.

According to Embodiment 3, as described above, the number of cells allocated to each DPB region of all stripe regions 38a to 38e can be inhibited from markedly increasing when compared with DPB regions of the other stripe regions. Therefore, the time needed to determine whether any cell belongs to each DPB region of each of the stripe regions 38a to 38e can be inhibited from becoming too long. As a result, the calculation time needed to calculate a pattern density or the like in a data processing area of the last stripe can be inhibited from delaying when compared with a data processing area of other stripe regions. Therefore, the writing time can be made shorter.

The embodiments have been described with reference to the concrete examples. However, the present disclosure is not limited to the concrete examples.

Although parts such as an apparatus configuration and a control method which are not directly required for the explanation of the present disclosure are not described, a required apparatus configuration or a required control method can be arbitrarily selected and used. For example, although the configuration of a control unit which controls the writing apparatus 100 is not described, a required control unit configuration can be arbitrarily selected and used as a matter of course.

In addition, all charged particle beam writing apparatuses and all methods therefor which include the elements of the present disclosure and can be obtained by arbitrary change of design by a person skilled in the art are included in the spirit and scope of the disclosure.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus, comprising:
   a judgment unit configured to input information about a stripe region height, and to judge, when a write region is divided into a plurality of stripe regions in a thin rectangular shape by the stripe region height, whether a height of a last stripe region of the plurality of stripe regions is narrower than the stripe region height;
   a stripe division unit configured to divide the write region into a plurality of stripe regions in the thin rectangular shape in such a way that the last stripe region and a stripe region prior to the last stripe region are combined to create one stripe region and stripe regions at least two stripe regions prior to the last stripe region are each created as stripe regions of the stripe region height if the height of the last stripe region is narrower than the stripe region height;
   a processing region division unit configured to divide each stripe region of the plurality of stripe regions divided into a plurality of processing regions in such a way that a number of beam shots is equivalent for each stripe region;
   a pattern density operation unit configured to operate a pattern density in each processing region in parallel for the plurality of processing regions for each stripe region;
   a dose operation unit configured to operate a dose of a beam by using the pattern density operated; and
   a pattern generator configured to write a pattern on a target object by using a charged particle beam of the dose operated.

2. The apparatus according to claim 1, further comprising:
   a composition processing unit configured to combine the last stripe region and the stripe region prior to the last stripe region if the height of the last stripe region is narrower than the stripe region height.

3. The apparatus according to claim 2, further comprising:
   a storage device configured to store write data of a chip having a plurality of cells constituted of at least one figure pattern; and
   a cell allocation unit configured to allocate a corresponding cell of the plurality of cells to a corresponding processing region of the plurality of processing regions divided if a portion of the corresponding cell is contained in the corresponding processing region.

4. The apparatus according to claim 3, further comprising:
   a belongingness judgment unit configured to judge whether all the figure patterns in each cell allocated to each of the processing regions belong to the processing region.

5. The apparatus according to claim 1, wherein the pattern density operation unit operates an area density of figure patterns arranged in each mesh region of a plurality of mesh regions obtained after each of the processing regions being divided into the plurality of mesh regions.

6. The apparatus according to claim 5, wherein the dose operation unit operates the dose by multiplying base doses of the beam by a correction coefficient dependent on the pattern density.

7. A charged particle beam writing apparatus, comprising:
   a stripe number operation unit configured to input information about a stripe region height, and to operate a number of stripe regions when a write region is divided into a plurality of stripe regions in a thin rectangular shape by the stripe region height;
   a stripe division unit configured to divide the write region into a plurality of stripe regions in the thin rectangular shape by a height obtained by the write region by the number of stripe regions;
   a processing region division unit configured to divide each stripe region of the plurality of stripe regions divided into a plurality of processing regions in such a way that a number of beam shots is equivalent for each stripe region;
   a pattern density operation unit configured to operate a pattern density in each processing region in parallel for the plurality of processing regions for each stripe region;
   a dose operation unit configured to operate a dose of a beam by using the pattern density operated; and
   a pattern generator configured to write a pattern on a target object by using a charged particle beam of the dose operated.

8. The apparatus according to claim 7, further comprising:
   a stripe height operation unit configured to operate the height obtained by dividing the write region by the number of stripe regions.

9. The apparatus according to claim 8, further comprising:
   a storage device configured to store write data of a chip having a plurality of cells constituted of at least one figure pattern; and
   a cell allocation unit configured to allocate a corresponding cell of the plurality of cells to a corresponding processing region of the plurality of processing regions if a portion of the corresponding cell is contained in the corresponding processing region.

10. The apparatus according to claim 9, further comprising:
    a belongingness judgment unit configured to judge whether all the figure patterns in each cell allocated to each of the processing regions belong to the processing region.

11. The apparatus according to claim 7, wherein the pattern density operation unit operates an area density of figure patterns arranged in each mesh region of a plurality of mesh regions obtained after each of the processing regions being divided into the plurality of mesh regions.

12. The apparatus according to claim 11, wherein the dose operation unit operates the dose by multiplying base doses of the beam by a correction coefficient dependent on the pattern density.

13. A charged particle beam writing apparatus, comprising:
    a judgment unit configured to input information about a stripe region height, and to judge, when a write region is divided into a plurality of stripe regions in a thin rectangular shape by the stripe region height, whether a height of a last stripe region of the plurality of stripe regions is narrower than the stripe region height;
    a stripe division unit configured to divide the write region into a plurality of stripe regions in the thin rectangular shape in such a way that the height of the last stripe region and a height of a stripe region prior to the last stripe region are combined and averaged to create two stripe regions of the same height and stripe regions at least two stripe regions prior to the last stripe region are each created as the stripe regions of the stripe region height if the height of the last stripe region is narrower than the stripe region height;

a processing region division unit configured to divide each stripe region of the plurality of stripe regions divided into a plurality of processing regions in such a way that a number of beam shots is equivalent for each stripe region; a pattern density operation unit configured to operate a pattern density in each processing region in parallel for the plurality of processing regions for each stripe region;

a dose operation unit configured to operate a dose of a beam by using the pattern density operated; and a pattern generator configured to write a pattern on a target object by using a charged particle beam of the dose operated.

14. The apparatus according to claim 13, further comprising:

an averaging processing unit configured to combine and average the height of the last stripe region and the height of the stripe region prior to the last stripe region to operate the same height if the height of the last stripe region is narrower than the stripe region height.

15. The apparatus according to claim 14, further comprising:

a storage device configured to store write data of a chip having a plurality of cells constituted of at least one figure pattern; and a cell allocation unit configured to allocate a corresponding cell of the plurality of cells to a corresponding processing region of the plurality of processing regions if a portion of the corresponding cell is contained in the corresponding processing region.

16. The apparatus according to claim 15, further comprising:

a belongingness judgment unit configured to judge whether all the figure patterns in each cell allocated to each of the processing regions belong to the processing region.

17. The apparatus according to claim 13, wherein the pattern density operation unit operates an area density of figure patterns arranged in each mesh region of a plurality of mesh regions obtained after each of the processing regions being divided into the plurality of mesh regions.

18. The apparatus according to claim 17, wherein the dose operation unit operates the dose by multiplying base doses of the beam by a correction coefficient dependent on the pattern density.

* * * * *